United States Patent [19]
Ohida et al.

[11] Patent Number: 5,786,271
[45] Date of Patent: Jul. 28, 1998

[54] PRODUCTION OF SEMICONDUCTOR PACKAGE HAVING SEMICONDUCTOR CHIP MOUNTED WITH ITS FACE DOWN ON SUBSTRATE WITH PROTRUDED ELECTRODES THEREBETWEEN AND SEMICONDUCTOR PACKAGE

[75] Inventors: Mitsuru Ohida; Hideo Aoki; Hiroshi Iwasaki, all of Yokohama, Japan

[73] Assignee: Kabushiki Kaisha Toshiba, Kawasaki, Japan

[21] Appl. No.: 675,213

[22] Filed: Jul. 3, 1996

[30] Foreign Application Priority Data

Jul. 5, 1995 [JP] Japan .................................. 7-169644

[51] Int. Cl.$^6$ .................................................. H01L 21/44
[52] U.S. Cl. .......................... 438/615; 438/613; 438/108; 257/778; 228/272.17
[58] Field of Search ........................ 437/183, 211, 437/212; 257/737, 738, 778; 438/613, 615, 108

[56] References Cited

U.S. PATENT DOCUMENTS

| | | | |
|---|---|---|---|
| 3,621,564 | 11/1971 | Tanaka et al. | 437/183 |
| 4,902,648 | 2/1990 | Ohta et al. | 437/247 |
| 5,123,163 | 6/1992 | Ishikawa et al. | 29/827 |
| 5,284,796 | 2/1994 | Nakanishi et al. | 437/183 |
| 5,306,664 | 4/1994 | Sakura | 437/183 |
| 5,450,283 | 9/1995 | Lin et al. | 257/787 |
| 5,536,973 | 7/1996 | Yamaji | 257/737 |
| 5,550,083 | 8/1996 | Koide et al. | 437/183 |
| 5,550,408 | 8/1996 | Kunitomoto et al. | 257/737 |
| 5,551,627 | 9/1996 | Leicht et al. | 437/183 |
| 5,578,874 | 11/1996 | Kurogi et al. | 257/778 |

FOREIGN PATENT DOCUMENTS

| | | | |
|---|---|---|---|
| 1-189942 | 7/1989 | Japan | 437/183 |
| 4-029340 | 1/1992 | Japan | 437/207 |

Primary Examiner—John Niebling
Assistant Examiner—Kevin F. Turner
Attorney, Agent, or Firm—Finnegan, Henderson, Farabow, Garrett & Dunner, L.L.P.

[57] ABSTRACT

A semiconductor package has a wiring circuit containing a conductive terminal formed on a first face of a substrate and a flat external connecting terminal electrically connected to the wiring circuit formed on a second face. An electrode pad is formed on a first face of a semiconductor chip. This semiconductor chip is mounted on the substrate with its first face down to oppose the first face of the substrate. A ball bump as a protruded electrode formed on the conductive terminal of the substrate and a ball bump as a protruded electrode formed on the electrode pad of the semiconductor chip are connected by solid phase diffusion. And, a sealing resin layer is formed in the space between the substrate and the semiconductor chip opposed to each other with a second face of the semiconductor chip exposed.

3 Claims, 4 Drawing Sheets

PRODUCTION OF SEMICONDUCTOR PACKAGE HAVING SEMICONDUCTOR CHIP MOUNTED WITH ITS FACE DOWN ON SUBSTRATE WITH PROTRUDED ELECTRODES THEREBETWEEN AND SEMICONDUCTOR PACKAGE

BACKGROUND OF THE INVENTION

1. Field of the Invention

The invention relates to a method for producing a semiconductor package to be mounted on memory cards or the like, and particularly to a method for producing a thin and compact semiconductor package having a semiconductor chip mounted with its face down and the semiconductor package thus produced.

2. Description of the Related Art

Various types of memory cards are known as a memory for recording or storing various kinds of data. In configuring such memory cards, their size and thickness are limited. Therefore, a semiconductor chip (e.g., IC device) contributing to, for example, a memory function is demanded to be mounted thin. In packaging the semiconductor chip, it is desired to make the package thin and compact.

As examples of a thin semiconductor package which meets such demands, TSOP (Thin Small Outline Package) and TCP (Tape Carrier Package) are known.

But, such thin semiconductor packages have the following disadvantages.

Since the TSOP has its substrate and the semiconductor chip to be mounted on it electrically connected by wire bonding, making the semiconductor package thin is limited because of "a height of wire loop+a height of sealing resin layer". In addition, this semiconductor package has a structure in that a lead frame is partly protruded from the side face of the package, so that it cannot be made compact in area and is not suitable for high density packaging.

On the other hand, the TCP has an advantage of capable of reducing its thickness as compared with the TSOP because it has a face-down type packaging structure with respect to a so-called carrier tape which corresponds to the substrate. But, the cost for producing the carrier tape is relatively high and a special molding die and a bonding tool are required according to the package size in the packaging process, resulting in a relatively high cost. Besides, it also has the same structure as the TSOP that its lead section is protruded, insufficient to make it compact in area. Thus, the TCP is not suitable for high density packaging.

This semiconductor package has a structure in that a semiconductor chip is mounted with its face down on the front face of a substrate which has external connection terminals on its back face, and the back face of the semiconductor chip, which does not oppose the substrate, is not sealed with a resin but exposed.

The above configured semiconductor package is desired to mount the semiconductor chip with its face down on the substrate by electrically connecting the semiconductor chip and the substrate with high reliability without any mechanical adverse effect such as an excess load on the substrate and the semiconductor chip or an uneven load on the semiconductor chip. Such a mechanical adverse effect may cause the substrate to warp, thereby mechanically damaging the semiconductor package, leading to for example an internal breakage of the semiconductor package.

SUMMARY OF THE INVENTION

The invention has been completed in view of the above disadvantages.

An object of the invention is to provide a method for producing a semiconductor package which is thin and compact in area with electrically and mechanically high reliability at a low cost with a high yield, and to provide the semiconductor package produced by this method.

Another object of the invention is to provide a method for producing a semiconductor package capable of mounting a semiconductor chip on a substrate by a less but uniform press load, and to provide the semiconductor package produced by this method.

Still another object of the invention is to provide a method for producing a semiconductor package capable of mounting a semiconductor chip on a substrate without warping the substrate or mechanically damaging the semiconductor package, and to provide the semiconductor package produced by this method.

To achieve the above objects, a first aspect of the invention relates to a method for producing a semiconductor package having a semiconductor chip, which has an electrode pad formed on its first face, mounted with its face down on a substrate which has on its first face a wiring circuit containing a conductive terminal formed and on its second face a flat external connecting terminal formed and electrically connected to the wiring circuit, which comprises forming a first protruded electrode on the conductive terminal of the substrate by wire bonding and forming a second protruded electrode on the electrode pad of the semiconductor chip by selective plating, flattening the first electrode, providing the substrate and the semiconductor chip to oppose the first protruded electrode and the second protruded electrode, pressing the substrate and the semiconductor chip to make the solid phase diffusion bonding of the first protruded electrode and the second protruded electrode, charging a sealing resin into the space between the substrate and the semiconductor chip opposed to each other with a second face of the semiconductor chip exposed, and curing the charged resin.

A second aspect of the invention relates to a method for producing a semiconductor package having a semiconductor chip, which has an electrode pad formed on its first face, mounted with its face down on a substrate which has on its first face a wiring circuit containing a conductive terminal formed and on its second face a flat external connecting terminal formed and electrically connected to the wiring circuit, which comprises forming a first protruded electrode having a first hardness on the conductive terminal of the substrate by wire bonding, and forming a second protruded electrode having a second hardness on the electrode pad of the semiconductor chip by wire bonding; providing the substrate and the semiconductor chip so as to oppose the first protruded electrode to the second protruded electrode; pressing the substrate and the semiconductor chip while applying heat to make the solid phase diffusion bonding of the first protruded electrode and the second protruded electrode; charging a sealing resin into the space between the substrate and the semiconductor chip opposed to each other with a second face of the semiconductor chip exposed; and curing the charged resin.

A third aspect of the invention relates to a method for producing a semiconductor package having a semiconductor chip with an electrode pad formed on its first face mounted with its face down on a substrate which has on its first face a conductive terminal formed, which comprises forming a first protruded electrode on the conductive terminal of the substrate, and forming a second protruded electrode on the electrode pad of the semiconductor chip; providing the substrate and the semiconductor chip so as to oppose the first protruded electrode to the second protruded electrode; connecting the first protruded electrode and the second protruded electrode; charging a sealing resin into the space between the substrate and the semiconductor chip opposed to each other; and curing the charged resin.

A fourth aspect of the invention relates to a semiconductor package which comprises a substrate which has first and second faces, a wiring circuit containing a conductive terminal formed on the first face, and a flat external connecting terminal electrically connected to the wiring circuit formed on the second face; a semiconductor chip which has first and second faces, an electrode pad formed on the first face, and the first face mounted with its face down to oppose the first face of the substrate; a ball bump formed on the conductive terminal of the substrate; a plated layer which is formed on the electrode pad of the semiconductor chip and connected to the ball bump by solid phase diffusion; and a sealing resin layer which is charged into the space between the substrate and the semiconductor chip opposed to each other with the second face of the semiconductor chip exposed.

A fifth aspect of the invention relates to a semiconductor package which comprises a substrate which has first and second faces, a wiring circuit containing a conductive terminal formed on the first face, and a flat external connecting terminal electrically connected to the wiring circuit formed on the second face; a semiconductor chip which has first and second faces, an electrode pad formed on the first face, and the first face mounted with its face down to oppose the first face of the substrate; a first ball bump formed on the conductive terminal of the substrate and having a first hardness; a second ball bump having a second hardness, which is formed on the electrode pad of the semiconductor chip and connected to the first ball bump by solid phase diffusion; and a sealing resin layer which is charged into the space between the substrate and the semiconductor chip opposed to each other with the second face of the semiconductor chip exposed.

A sixth aspect of the invention relates to a semiconductor package which comprises a substrate which has first and second faces and a conductive terminal formed on the first face, a semiconductor chip which has first and second faces and an electrode pad formed on the first face, a first protruded electrode formed on the conductive terminal of the substrate, a second protruded electrode which is formed on the electrode pad of the semiconductor chip and connected to the first protruded electrode, and a sealing resin layer which is formed in the space between the substrate and the semiconductor chip opposed to each other.

The invention is on the precondition that a semiconductor chip (such as an IC chip) is mounted with protruded electrodes mutually opposed on one main surface (first face) of a resin substrate or ceramics substrate, a mold sealing resin layer is omitted from the top face of the mounted part to make the product thin and compact and cost reduction, and an external connecting terminal is guided out to the other main face (second face) of the substrate to facilitate the production of a semiconductor package. The flat external connecting terminal guided to and provided on the second face of the substrate is for example LGA (Land Grid Array) or BGA (Ball Grid Array), and arranged in the shape of a staggered grid having a pitch of 1 mm and a grid diameter of 0.5 mm.

A first point of the invention is to easily secure the good entire connection by opposing and connecting the protruded electrodes which are formed on the conductive terminal of the substrate and on the electrode pad of the semiconductor chip while preventing the semiconductor chip mounted with the face down from being damaged. And, a second point is to omit the top mold sealing resin layer by utilizing the fact that the surface of a silicon (Si) semiconductor chip is solid and tough, thereby making the semiconductor package thin.

Materials for the protruded electrodes include Au, Ag, Ni, Al, Sn, solder, etc., and the same type of material or a different type may be used to form them on the conductive terminal and the electrode pad. When a relatively soft material such as Ag is used for at least either of the protruded electrodes, electrical connection with a lower contact resistance can be attained by opposing and pressing.

In the process of producing this semiconductor package, so-called solid phase diffusion may be caused between the protruded electrodes in order to make rigid connection of the opposed and aligned protruded electrodes on the substrate and the semiconductor chip. Specifically, the protruded electrode of the substrate and the corresponding protruded electrode of the semiconductor chip are heated to a temperature at which necessary solid phase diffusion can be made, metals forming the protruded electrodes, namely gold bumps, are subjected to the solid phase diffusion to electrically and mechanically connect. And, this solid phase diffusion bonding employs a process to heat the protruded electrode of the substrate or the protruded electrode of the semiconductor chip, or both of them to a temperature at which the required solid phase diffusion can be made, prior to the positioning and arrangement of the substrate and the semiconductor chip.

And, in the semiconductor package according to the invention, since the face-down type connection and mounting of the semiconductor chip to the substrate is made by mutual pressure bonding of the protruded electrode of the substrate and the protruded electrode of the semiconductor chip, minor differences in height of the protruded electrodes can be easily remedied, and the connection and mounting can be made with high reliability. In addition, the sealing resin is extensively reduced and the external connecting terminal is guided to be exposed on the back face of the substrate to reduce thickness, so that the produced semiconductor package functions as a high densely packed semiconductor package.

Besides, in the method according to the invention, since the protruded electrodes are mutually provided on the substrate and the semiconductor chip, a warp, if any, in the substrate or the semiconductor chip can be easily compensated in a process of pressure bonding and connection for the connection and mounting of the semiconductor chip with its face down onto the substrate surface, so that a damage to the semiconductor chip can be prevented, and the protruded electrodes can be mutually connected securely. Furthermore, since the resin for sealing is extensively reduced and the external connecting terminal is guided to be exposed on the back face of the substrate, a semiconductor package which is thin and for highly dense packaging can be provided.

DESCRIPTION OF THE PREFERRED EMBODIMENTS

Embodiment 1

Figure 1:
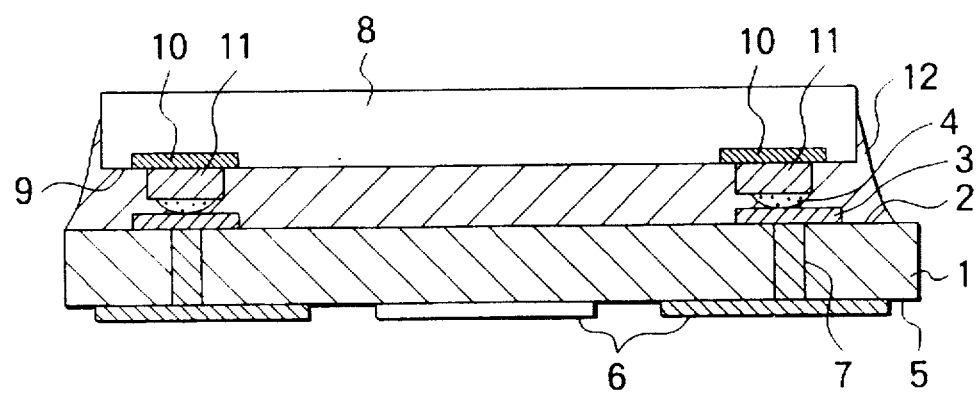
FIG. 1 is a sectional view showing a structure of the semiconductor package according to one embodiment of the invention.

FIG. 1 shows a cross section of the essential structure of the semiconductor package according to Embodiment 1.

In FIG. 1, reference numeral 1 designates a ceramics substrate such as an alumina or aluminum nitride wiring board. The substrate 1 has a conductive terminal 3 provided on a first face 2. The conductive terminal 3 has an Au protruded electrode 4 formed by wire bonding, for example.

The substrate 1 has a flat external connecting terminal 6 provided on a second face 5. The external connecting terminal 6 provided on the second face 5 and the connecting terminal 3 provided on the first face 2 are connected by internal connecting means 7 provided in the substrate 1, such as through hole connection or via connection.

This semiconductor package has a structure so that it can be directly surface-mounted on the surface of a mother board via the aforementioned external connecting terminal 6.

Reference numeral 8 designates a semiconductor chip such as an IC chip mounted and packaged with its face down on the first face 2. An electrode pad 10 is provided on a first face 9 of the semiconductor chip 8 opposed to the first face 2 of the substrate 1. The electrode pad 10 is provided with an Au protruded electrode 11 formed by a selective plating method, for example.

The mounting and packaging are conducted by opposed junction or diffused junction of the corresponding end faces of the Au protruded electrode 4 and the Au protruded electrode 11.

Reference 12 designates a sealing resin layer which fills a space between the surface of the substrate 1 and the bottom face of the mounted and packaged semiconductor chip 8 to integrally join them.

Now, a method for producing a semiconductor package having the above structure will be described with reference to FIG. 2.

First, the ceramics substrate 1 is provided which has a wiring circuit containing the conductive terminal (conductive pad) 3 for mounting a flip chip on the first face 2 and a structure in that the flat external connecting terminal 6 is guided to the second face 5 from the wiring circuit including the conductive terminal 3 by the through hole connection or via connection. This substrate 1 has for example a length of 15 mm, a width of 15 mm and a thickness of 0.2–0.4 mm, and mounts on it the conductive chip (IC chip) 8 having a length of 13 mm, a width of 13 mm and a thickness of 0.3 mm.

Figure 2A:
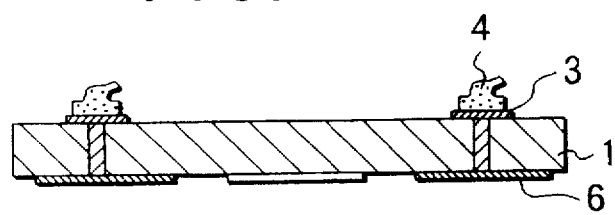
FIG. 2A to FIG. 2G are sectional views for illustrating the production process according to the invention.

As shown in FIG. 2A, the Au protruded electrode 4 having, for example, a height of 50 μm and a crush diameter of about 95 μm was formed on the surface of each conductive terminal 3 on the substrate 1 by wire bonding.

Figure 2B:
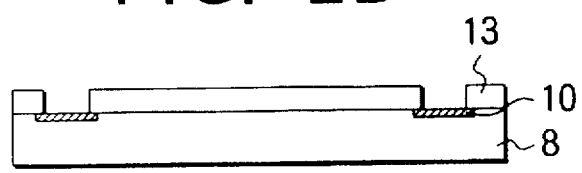
Figure 2C:
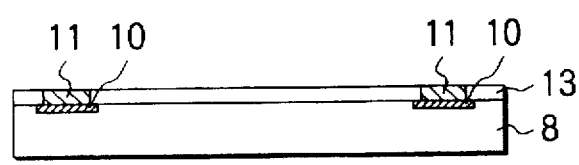
Figure 2D:
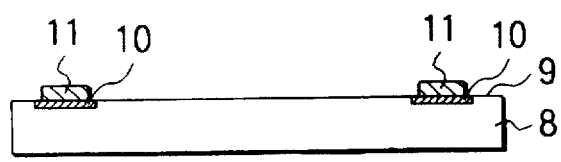

As shown in FIG. 2B to FIG. 2D, a resist film 13 was formed on the surface of the semiconductor chip 8 where the electrode pad 10 was provided, and the area where each electrode pad 10 was provided was opened by photolithography (2B). Then, the protruded electrode 11 was formed by growing an Au layer in each opening by the selective plating method (2C), and the resist film 13 was removed, thereby obtaining the semiconductor chip 8 having the Au protruded electrode 11 provided on the surface of each electrode pad 10, namely on the first face 9 (2D).

Figure 2E:
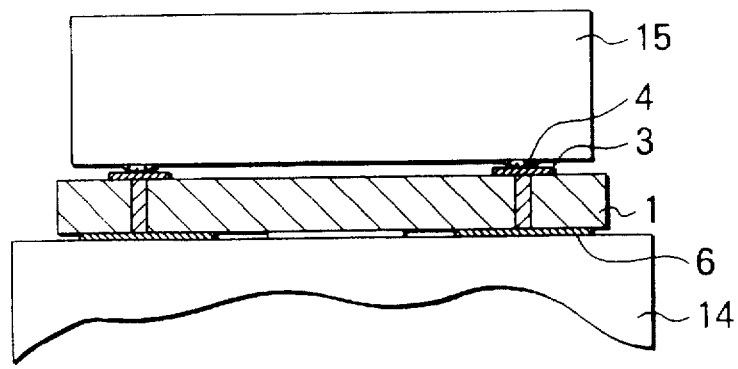

Then, as shown in FIG. 2E, the substrate 1 was put on a stage 14 of a flip chip bonder, the protruded electrode 4 was pressed (pressurized) by a bonding tool 15 having a mirror-finished face opposed to the substrate 1 to flatten the top face of the protruded electrode 4.

Figure 2F:
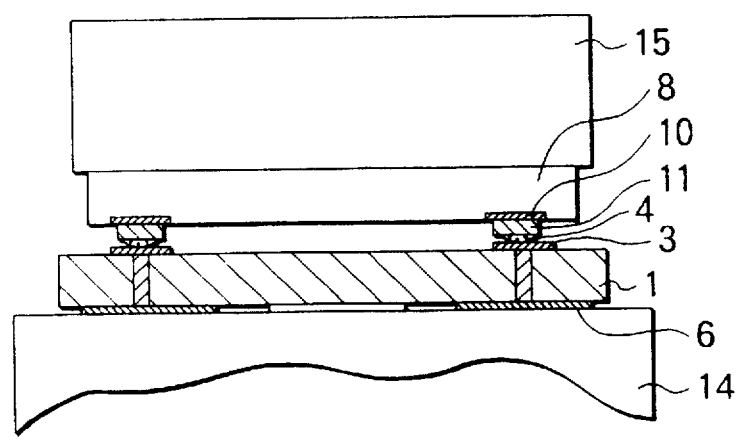

As shown in FIG. 2F, the semiconductor chip 8 was adhered to and held by the bonding tool 15, and the protruded electrodes 4, 11, which were to be connected by corresponding and aligning the protruded electrode 11 of the semiconductor chip 8 to the protruded electrode 4 of the substrate 1, were pressed, thereby fixing and connecting the semiconductor chip 8 electrically.

In this mounting process, since the bonding tool 15 and the flip chip bonder stage 14 were heated to, for example, about 250° to 350° C. and a load was applied at about 100–300 gf per bump, the protruded electrodes 41 11 were mutually undergone solid phase diffusion, resulting in fixing and connecting (packaging) the semiconductor chip 8 with high reliability. In other words, even when the loads applied to press the protruded electrodes 4, 11 were different due to the warp of the substrate 1, the effects by the warp were readily compensated by the protruded electrodes 4, 11, thereby completely remedying a possibility of damages to the semiconductor chip 8 due to an excess load which was partly applied to the protruded electrodes.

Figure 2G:
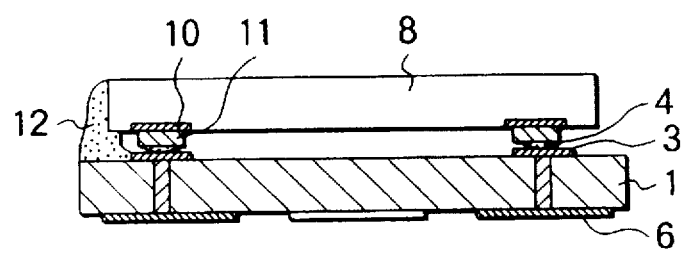

Then, processing with a sealing resin is carried out. Specifically, a thermosetting epoxy resin containing a filler such as silica powder is flown to fill the space between the bottom face of the semiconductor chip 8 and the top face of the substrate 1 from one side of the space as shown in FIG. 2G by utilizing a so-called capillary phenomenon. In this selective resin processing, when the substrate 1 is heated to about 60° to 80° C. to lower the viscosity of the sealing resin, the charging of the resin into the space is facilitated. And, this sealing resin process is preferable to cover the side faces of the semiconductor chip 8 with part of the sealing resin. After completing the prescribed resin processing, the filled resin is cured (solidified) by heating, namely by step curing at 100° C. for four hours and at 150° C. for two hours. Thus, the produced semiconductor package is provided with the closely-packed sealing resin layer 12 and has the structure in cross section as shown in FIG. 1.

The semiconductor chip 8 of the semiconductor package is more preferably solidified against the surface of the substrate 1 by virtue of the sealing resin layer 12, and electrical isolation is provided between the surface of the semiconductor chip 8 and the surface of the substrate 1. Meanwhile, the semiconductor chip 8 has its top face exposed, but this exposed surface of the semiconductor chip 8 is protected because its material silicon is solid and tough. Thus, it was assured that there is no problem in its reliability even if the top face was not covered.

Embodiment 2

Figure 3:
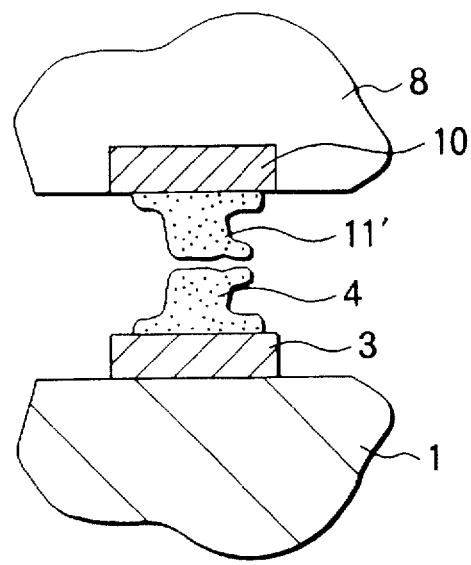
FIG. 3 is an enlarged view of a connection of the semiconductor package according to another embodiment of the invention.

In Embodiment 1, the protruded electrodes were the Au protruded electrode 4 formed on the substrate 1 by the wire bonding and the protruded electrode 11 formed on the semiconductor chip 8 by growing the Au layer by the selective plating method. But, as shown in FIG. 3, protruded electrodes 4, 11' may be formed on the conductive terminal 3 of the substrate 1 and the electrode pad 10 of the semiconductor chip 8 by the wire bonding.

In that case, the protruded electrodes 4, 11' are desired to be different in hardness, so that even when different loads are applied to the protruded electrodes 4, 11', a warp is readily compensated by the protruded electrodes 4, 11', thereby remedying a possibility of damages to the semiconductor chip 8 due to the application of an excess load to part of the protruded electrodes.

The protruded electrodes 4, 11' may have different hardness by using Au for the one and Al or Pd for the other.

Embodiment 3

In the process of producing the semiconductor chip 8 in Embodiment 1, solder (e.g., 63 Sn-37 Pb) was formed into the protruded electrode 11 having a height of 50–70 μm on the surface of the electrode pad 10 (100×100 μm) by the selective plating or evaporating (using a solder mask). And, the substrate 1 had the protruded electrode 4 provided on the surface of the conductive terminal 3 by the screen printing of a solder paste, the semiconductor chip 8 was positioned and temporarily fixed on the surface of the substrate 1 by the flip chip bonding, and fixed by heating to the melting temperature (183° C.) or higher of the solder by passing through a reflow furnace.

Then, the resin was selectively filled under the same conditions as in Embodiment 1 to produce a semiconductor package. This semiconductor package was also thin and compact and had high reliability in characteristics and a high yield like the one produced in Embodiment 1.

Embodiment 4

In the process of Embodiment 1, the substrate 1 was adsorbed to the surface of the flip chip bonder stage 14 in a vacuum and heated so that at least the Au protruded electrode 4 of the substrate 1 had a temperature in a range of 300° to 400° C., for example. Then, the Au protruded electrode 11 formed on at least the electrode pad 10 of the semiconductor chip 8 which was fixed to and held by the flip chip bonder (pickup head) by vacuum adsorption was heated to a temperature in a range of 300° to 400° C., for example. In this state, the protruded electrode 11 of the semiconductor chip 8 was faced to and aligned to the protruded electrode 4 of the substrate 1, and to effect the solid phase diffusion and connection of the mutually opposed protruded electrodes 4, 11, a prescribed load (pressure) of, e.g., 100 to 200 g per bump was applied from above the semiconductor chip 8.

The solid phase diffusion bonding means to plastically deform the boundary surfaces of the same or different type of metals to promote the breakage of the oxidized film and the surface activation at the connected part and to contact the newly produced surfaces mutually to disperse and connect the metals.

In that sense, the solid phase diffusion bonding of the Au protruded electrodes 4, 11 in this embodiment is not limited to the embodiment described above when metals can be subjected to the solid phase diffusion bonding, and it can be applied to the connection of various types of metals without departing from the scope of the invention. For example, it is possible to connect an Sn protruded electrode and the Au protruded electrode, and an Al protruded electrode and the Au protruded electrode.

In this embodiment, the Au protruded electrode 4 of the substrate 1 positioned on the stage of the bonder and the Au protruded electrode 11 of the semiconductor chip 8 attached to the pickup head were heated to the prescribed temperature, but only either of them can be heated to the prescribed temperature if the solid phase diffusion bonding can be made. Besides, if the solid phase diffusion bonding can be made by using ultrasonic oscillation without increasing a temperature, it is not necessary to heat.

After removing from the stage, the sealing resin was charged into the space between the substrate 1 and the semiconductor chip 8 under the same conditions as in Embodiment 1. In the resin charging process, the capillary phenomenon is promoted by appropriately increasing the temperature, and the resin charging process can be further facilitated. After the required resin charging process, the charged resin was cured to produce the semiconductor package which had the solid phase diffusion bonding section firmly fixed and connected.

Embodiment 5

The resin substrate (or alumina substrate or aluminum nitride substrate) 1 which had on its top face a flip chip packaging wiring circuit containing the conductive element 3 having the Au protruded electrode 4 formed and also had the flat external connection terminal 6 guided to be arranged on the other main face, the semiconductor chip 8 having the Au protruded electrode 11 (a height of 30 μm, a length of 100 μm, a width of 100 μm) provided on the electrode pad 10 by electroplating (or ball bonding) were provided.

The substrate 1 and the semiconductor chip 8 were positioned and arranged on the stage of the flip chip bonder in the same way as in Embodiment 1. The positioning and arrangement were conducted by vacuum adsorbing the resin substrate 1 to prevent the substrate 1 from warping and to position it flat, positioning and arranging the protruded electrode 11 of the semiconductor chip 8 to correspond to the Au protruded electrode 4 of the resin substrate 1, and applying a load (pressure) from above the semiconductor chip 8 to firmly adhere the opposed end faces of the protruded electrodes 4, 11.

Then, the sealing resin was charged in the space between the substrate 1 and the semiconductor chip 8 while keeping the applied pressure under the same conditions as in Embodiment 1. In the resin charging process, the capillary phenomenon was promoted by appropriately increasing the temperature, and the resin charging process could be further facilitated. After the required resin charging process, the heating treatment was conducted while keeping a required load applied to the semiconductor chip 8. The charged resin was cured by this heating treatment to prevent the mutually opposed protruded electrodes from being displaced, and the semiconductor package having the semiconductor chip 8 fixed to and held by the substrate 1 was produced while keeping the intimate contact.

In this production method, since heating at a high temperature involved in the solid phase diffusion bonding is not required, the connected section does not have a stress strain which is involved in the thermal expansion when the circuit board 1 and the semiconductor chip B are connected. Therefore, the semiconductor package is proved to have advantageous reliability by the reliability test such as a heat cycle at high and low temperatures to be conducted afterward.

The invention is not limited to the above embodiments and can be modified variously without departing from the scope of the invention. For example, an alumina substrate or an aluminum nitride substrate may be used, and its size may be selected according to the size of a semiconductor chip to be mounted and packaged.

Figure 4:
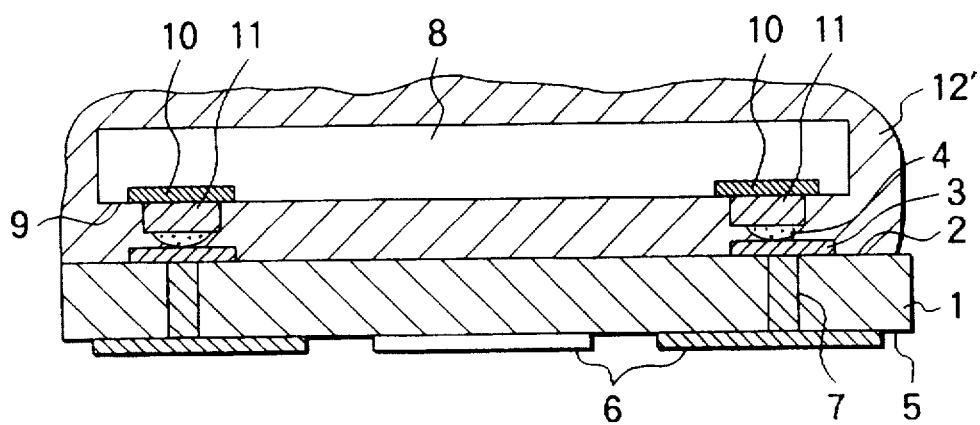
FIG. 4 is a diagram showing another structure of the semiconductor package according to the invention.

In the above embodiments, the sealing resin layer 12 was charged into the space between the substrate 1 and the semiconductor chip 8 which were mutually opposed with the second face of the semiconductor chip 8 exposed. But, as shown in FIG. 4, the sealing resin layer 12 may be charged into the space between the substrate 1 and the semiconductor chip 8 so as to cover the second face of the semiconductor chip 8.

According to the structure of the invention, when it is assumed that the substrate 8 has a thickness of 0.2–0.4 mm, the semiconductor chip has a thickness of 0.25–0.3 mm and the space between the substrate 8 and the semiconductor chip is 0.03–0.05 mm, the semiconductor package having an overall thickness of 0.5–0.7 mm can be attained.

As described above, the invention achieves the connecting and packaging structure with high reliability, the sealing resin is extremely reduced, the external connecting terminal is led to and exposed on the back face of the substrate to reduce the thickness. Thus, these factors are suitable to provide a high densely packed semiconductor package.

Even when the substrate or the semiconductor chip has a warp, it can be readily compensated by the opposed protruded electrodes by pressure welding and connecting to prevent the semiconductor chip from being damaged; and with the sealing resin extensively reduced and the external connecting terminal guided to be exposed to the back face of the substrate, a semiconductor package which is thin and for high dense packaging can be provided with a high yield.

Besides, since the protruded electrodes are formed by the selective plating or the wire bonding, a semiconductor package which is thin and for high dense packaging can be provided more easily and with a high yield.

In addition, in mutual pressure welding, (diffusing) and connecting of the Au protruded electrodes, the protruded electrodes are preheated to facilitate the pressure welding, (diffusing) and connecting, so that a semiconductor package which is highly reliable, thin and for high dense packaging can be provided with a high yield.

What is claimed is:

1. A method for producing a semiconductor package having a semiconductor chip, which has an electrode pad formed on its first surface and is mounted face down on a substrate which has formed on its first surface a wiring circuit containing a conductive terminal and on its second surface a flat external connecting terminal, which is electrically connected to said wiring circuit, the method comprising the steps of:

(a) forming a first protruded electrode, which is solid and has a top surface, on the conductive terminal of said substrate by wire bonding and forming a second protruded electrode on the electrode pad of said semiconductor chip by selective plating, (b) flattening said first protruded electrode, (c) providing said substrate and said semiconductor chip so as to oppose said first protruded electrode to said second protruded electrode, (d) pressing said substrate and said semiconductor chip to make a solid phase diffusion bonding of said first protruded electrode and said second protruded electrode, (e) charging a sealing resin into a space between said substrate and said semiconductor chip opposed to each other with a second surface of said semiconductor chip exposed, and (f) curing said charged resin, wherein said substrate and said semiconductor chip are pressed while being heated in step (d), and a temperature for heating said substrate and said semiconductor chip is in a range of about 200° to 400° C. and a press load is in a range of 100 to 300 gf per bump.

2. The method as set forth in claim 1, wherein said first electrode is made flat by pressing the top surface of said first electrode from above by a bonding tool in the step (b), and pressing said substrate and said semiconductor chip by said bonding tool in the step (d).

3. The method as set forth in claim 1, wherein the step of forming said protruded electrode in the step (a) comprises the steps of:

forming a resist film on the first surface of said semiconductor chip, removing the resist film from part of the electrode pad of said semiconductor chip by photolithography, and forming said second protruded electrode by growing an Au layer by a selective plating method on the part of the electrode pad where said resist film has been removed.

* * * * *